United States Patent
Hshieh et al.

(10) Patent No.: US 6,555,895 B1
(45) Date of Patent: Apr. 29, 2003

(54) DEVICES AND METHODS FOR ADDRESSING OPTICAL EDGE EFFECTS IN CONNECTION WITH ETCHED TRENCHES

(75) Inventors: Fwu-Iuan Hshieh, Saratoga, CA (US); Koon Chong So, Fremont, CA (US); Yan Man Tsui, Union City, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 09/617,356

(22) Filed: Jul. 17, 2000

(51) Int. Cl.$^7$ ............................... H01L 26/68
(52) U.S. Cl. ................ 257/622; 257/618; 257/626
(58) Field of Search ........................ 257/328, 618, 257/622, 626, 496, 510, 513, 521, 586, 594, 396–399; 716/19, 21

(56) References Cited

U.S. PATENT DOCUMENTS

| | | | |
|---|---|---|---|
| 5,072,266 A | 12/1991 | Bulucea et al. | 257/330 |
| 5,468,982 A | * 11/1995 | Hshieh et al. | 257/622 |
| 5,847,421 A | 12/1998 | Yamaguchi | 257/207 |
| 5,864,159 A | 1/1999 | Takahashi | 257/330 |
| 5,877,528 A | 3/1999 | So | 257/341 |
| 5,900,349 A | 5/1999 | Han | 430/311 |
| 5,946,563 A | 8/1999 | Uehara | 438/183 |
| 5,981,999 A | 11/1999 | Liu et al. | 257/339 |
| 6,005,271 A | * 12/1999 | Hshieh | 257/341 |
| 6,031,265 A | 2/2000 | Hshieh | 257/334 |
| 6,063,669 A | 5/2000 | Takaishi | 438/270 |
| 6,372,605 B1 | * 4/2002 | Kuehne et al. | 257/510 |

FOREIGN PATENT DOCUMENTS

| | | | |
|---|---|---|---|
| EP | 0420489 A2 | 9/1990 | G03F/7/20 |
| EP | 0580213 A1 | 7/1993 | H01L/29/784 |
| EP | 0726603 A2 | 2/1996 | H01L/29/78 |

OTHER PUBLICATIONS

H. R. Chang, et al., IEEE Trans. on Electron Devices, vol. ED–34 No. 11 (1987) 2329–2334.*
J. Fung Chen, et al., "Practical Method for Full–Chip Optical Proximity Correction," SPIE Proceedings, vol. 3051, 1997, pp. 790–803.
J. Fung Chen, et al., "An OPC Roadmap to 0.14mm Design Rules," SPIE Proceedings, vol. 3236, 1997, pp. 382–396.

(List continued on next page.)

*Primary Examiner*—Minh Loan Tran
*Assistant Examiner*—Thomas L Dickey
(74) *Attorney, Agent, or Firm*—Mayer Fortkort & Williams, PC; David B. Bonham, Esq.; Karin L. Williams, Esq.

(57) ABSTRACT

In a first aspect of the invention, a modified semiconductor substrate is provided. The modified substrate comprises: (1) a semiconductor substrate; (2) at least one buffer layer provided over at least a portion of the substrate; and (3) a plurality of trenches comprising (a) a plurality of internal trenches that extend into the semiconductor substrate and (b) at least one shallow peripheral trench that extends into the at least one buffer layer but does not extend into the semiconductor substrate. In another aspect, a method of selectively providing trenches in a semiconductor substrate is provided. According to a further aspect of the invention, a trench DMOS transistor structure that includes at least one peripheral trench and a plurality of internal trenches is provided. The structure comprises: (1) a substrate of a first conductivity type; (2) a body region on the substrate having a second conductivity type, wherein the peripheral and internal trenches extend through the body region; (3) an insulating layer that lines each of the peripheral and internal trenches; (4) a first conductive electrode overlying each insulating layer; and (5) source regions of the first conductivity type in the body region adjacent to the each internal trench, but not adjacent to the at least one peripheral trench.

13 Claims, 6 Drawing Sheets

OTHER PUBLICATIONS

J. Li et al., "Model–based Optical Proximity Correction Including Photo–resist Effects," SPIE Proceedings, V.3051, 1997, p. 643–651.

N. Shamma, et al., "A Method for Correction of Proximity Effect in Optical Lithography," KTI Microlithograpohy Seminar Interface '91, pp. 145–149.

Chris A. Mack, "Evaluating Proximity Effects Using 3–D Optical Lithography Simulation," Semiconductor International Jul. 1996, pp. 237–242.

O. Otto, et al., "Automated Optical Proximity Correction—A Rules–Based Approach," SPIE Proceedings, V. 2179,1994, pp. 278–293.

A. Kornblit, et al., "Role Of Etch Pattern Fidelity In The Priniting Of Optical Proximity Corrected Photomasks," Journal of Vaccuum Science Technology, vol. B 13(6), Nov./Dec. 1995, pp. 2944–2948.

J. Fung Chen, et al., "Practical I–Line OPC Contact Masks For Sub–0.3 Micron Design Rule Application: Part 1—OPC Design Optimization," Unknown source, pp. 181–120.

Akio Misaka, et al., "A Statistical Gate CD Control Including OPC," Symposium on VLSI Technology Digest of Technical Papers, 1998, pp. 170–171.

J. Xiao, et al., "Process Latitude Considerations of Mask–Plane Proximity Correction in Advanced Optical Lithography," Unknown source, pp. 271–274.

Victor Boksha, et al., "Proximity Correction Methodology Using Contemporary Photolithoography and Topography Simulators," Unknown source, pp. 282–286.

* cited by examiner

DEVICES AND METHODS FOR ADDRESSING OPTICAL EDGE EFFECTS IN CONNECTION WITH ETCHED TRENCHES

At present, semiconductor process technology is capable of creating features having dimensions well into the submicron range. At this level of miniaturization, feature size variations due to what is commonly referred to as the "optical proximity effect" can become significant. In general, proximity effects are variations in feature dimensions that are due to the proximity of other nearby features. In particular, optical proximity effects are proximity effects that occur during optical lithography. As a result of optical proximity effects, the size of a given feature can vary based on its spacing from other features.

Among the phenomena contributing to optical proximity effects are diffraction patterns associated with imaged features. One example of an optical proximity effect is the difference in dimension that can occur between an isolated printed line and a printed line in a dense array of equal lines.

Specific consequences of optical proximity effects include situations where internal features, which are surrounded by other features, and peripheral features, which are not, differ substantially. (Under these circumstances, optical proximity effects are frequently referred to as optical edge effects.) For example, at present, during photolithographic processes at submicron feature sizes, peripheral photoresist features frequently display a significant optical edge effect. As a result, etched silicon trenches, among other features, are frequently and adversely affected. Accordingly, devices employing etched silicon trenches, such as trench DMOSFETS (double diffused metal oxide semiconductor field effect transistors), trench Schottky barrier rectifiers, DRAM (dynamic random access memory) devices, and devices in which trenches are used to isolate separate integrated circuits, are likewise frequently and adversely effected by the optical edge effect.

An example of such an edge effect is presented in FIG 1A and 1B. These figures illustrate a situation where trenches are etched using apertures between the photoresist features. More specifically, as seen in FIG 1A, a silicon substrate 10 is provided with photoresist features 15$a$, 15$b$, 15$c$, 15$d$ via an optical lithography process. As shown in this figure, the internal features 15$a$, 15$b$ and 15$c$, each of which is positioned between other features (the feature to the left of internal feature 15$a$ is not shown here), have substantially vertical sidewalls. Unfortunately, as a consequence of the optical edge effect discussed herein, peripheral feature 15$d$, which is not positioned between other features, has a substantially oblique sidewall as shown.

FIG. 1B illustrates the results that are obtained after subjecting the photoresist-patterned silicon substrate to an etch step. As can be seen in this figure, due to the substantially vertical nature of the sidewalls associated with photoresist features 15$a$, 15$b$ and 15$c$, silicon sidewalls 10$a$, 10$b$ and 10$c$ are also substantially vertical. In contrast, due to the substantially oblique nature of the sidewalls associated with photoresist feature 15$d$, silicon sidewall 10$d$ is also substantially oblique, resulting in a sharp corner at the trench bottom.

In other instances, a silicon substrate is etched using a silicon oxide or silicon nitride photomask. Referring to FIG. 2A, a silicon oxide or nitride layer is etched via photoresist features 15$a$, 15$b$, 15$c$, 15$d$, to form silicon oxide or silicon nitride features 17$a$, 17$b$, 17$c$, 17$d$ on silicon substrate 10. As shown in this figure, the internal photoresist features 15$a$, 15$b$, 15$c$, each of which is positioned between other photoresist features, have substantially vertical sidewalls, while the peripheral photoresist feature 15$d$, which is not positioned between other photoresist features, has a substantially oblique sidewall. The same is true of the silicon oxide or nitride features 17$a$–17$d$. Photoresist features 15$a$, 15$b$, 15$c$ and 15$d$ are then removed, leaving only oxide or nitride features 17$a$, 17$b$, 17$c$ and 17$d$. FIG. 2B illustrates the result of etching the silicon substrate 10 using silicon oxide or silicon nitride features 17$a$, 17$b$, 17$c$ and 17$d$ alone as masking features. As can be seen, the results are largely the same as those achieved when the substrate 10 is etched using photoresist features 15$a$, 15$b$, 15$c$ and 15$d$ (see FIG. 1B). Specifically, due to the substantially vertical nature of the sidewalls associated with silicon oxide or silicon nitride features 17$a$, 17$b$, 17$c$, silicon sidewalls 10$a$, 10$b$ and 10$c$ are also substantially vertical. Furthermore, silicon oxide or silicon nitride feature 17$d$ has a substantially oblique sidewall, which results in a trench feature having a substantially oblique silicon sidewall 10$d$ and an accompanying sharp corner at the trench bottom.

In still other instances, a silicon substrate is etched through a mask defined by both photoresist features and silicon oxide or nitride features. As shown in FIG. 3, the internal photoresist features 15$a$, 15$b$, 15$c$, each of which is positioned between other photoresist features, have substantially vertical sidewalls, while the peripheral photoresist feature 15$d$, which is not positioned between other photoresist features, has a substantially oblique sidewall as shown. The same is true of the silicon oxide or nitride features 17$a$–17$d$. As to the silicon substrate 10, due to the substantially vertical nature of the sidewalls associated with features 15$a$/17$a$, 15$b$/17$b$ and 15$c$/17$c$, silicon sidewalls 10$a$, 10$b$ and 10$c$ are also substantially vertical. In contrast, due to fact that feature 15$d$/17$d$ is oblique and is comprised of a combination of photoresist and oxide or nitride, a sharp corner is formed at the trench bottom, as was observed in connection with FIGS. 1 and 2B. Moreover, the silicon substrate 10 is undercut at the interface that is formed with the oxide or nitride feature 17$d$.

In each of the above cases, the optical proximity effect produces undesirable trench characteristics, including sloping sidewalls and sharp-cornered bottoms. Accordingly, there is a need in the art to address optical proximity effects on etched trench features.

Others have addressed problems arising from optical proximity effects in DRAM applications by putting dummy trenches around the cells. See, e.g., J. Fung Chen, Tom Laidig, Kurt E. Wampler and Roger Caldwell, "Practical Method for Full-Chip Optical Proximity Correction," SPIE Proceedings, Vol.3051,1997; J. Fung Chen, Tom Laidig, Kurt E. Wampler and Roger Caldwell, "An OPC Roadmap to 0.14 mm Design Rules," paper presented at BACUS, 1997; J. Li, D. Bernard, J. Rey, V. Boksha, "Model-Based Optical Proximity Correction Including Photo-resist Effects," Proc. SPIE, V.3051, 1997, P.643–651; N. Shamma, F. Sporon-Fiedler, E. Lin, "A Method for Correction of Proximity Effect in Optical Lithography," KTI Microlithography Seminar Interface '91, P.145; Chris A. Mack, "Evaluating Proximity Effects Using 3-D Optical Lithography Simulation," Semiconductor International July 1996 P.237; O. Otto etc, "Automated optical proximity correction—a rule-based approach," SPIE Proceedings, V.2197,P.278, 1994; A. Kornblit etc, "Role of etch pattern fidelity in the printing of optical proximity corrected photomasks," EIPB'95, 1995.

However, a need nonetheless remains in the art for alternative methods of addressing these problems.

SUMMARY OF THE INVENTION

These and other needs in the art are addressed by the present invention.

According to a first aspect of the present invention, a modified semiconductor substrate is provided. The modified substrate comprises: (1) a semiconductor substrate; (2) at least one buffer layer provided over at least a portion of the substrate; and (3) a plurality of trenches comprising (a) a plurality of internal trenches that extend into the semiconductor substrate and (b) at least one shallow peripheral trench that extends into the at least one buffer layer but does not extend into the semiconductor substrate.

In one preferred embodiment, the at least one buffer layer is provided over the semiconductor substrate in the area of the at least one shallow peripheral trench, while no buffer layer is provided over the semiconductor substrate in the area of the plurality of internal trenches.

In another preferred embodiment, at least one buffer layer is provided over the semiconductor substrate in the area of the at least one shallow peripheral trench and at least one buffer layer is provided over the semiconductor substrate in the area of the plurality of internal trenches. However, the at least one buffer layer in the area of the plurality of internal trenches is thinner than the at least one buffer layer in the area of the at least one shallow peripheral trench. (For example, the at least one buffer layer in the area of the plurality of internal trenches can consist of a single buffer layer, while the at least one buffer layer in the area of the at least one shallow peripheral trench can consist of two buffer layers.) As a result, each internal trench extends through the at least one buffer layer in the area of the plurality of internal trenches and into the semiconductor substrate, while each shallow peripheral trench does not extend through the at least one buffer layer in the area of the at least one shallow peripheral trench (and thus does not extend into the semiconductor substrate).

According to another aspect of the present invention, a method of providing trenches in a semiconductor substrate is provided. The method comprises (1) providing a semiconductor substrate; (2) providing a patterned etch resistant layer over the substrate, the patterned layer having a plurality of trench apertures comprising (a) at least one peripheral trench aperture and (b) a plurality of internal trench apertures; (3) providing at least one buffer layer between each peripheral trench aperture and the semiconductor substrate; and (4) conducting an etching process, wherein an internal trench is etched in the semiconductor substrate at each internal trench aperture position, and a peripheral trench is prevented from being etched into the semiconductor substrate at each peripheral aperture position by the at least one buffer layer.

In one preferred embodiment, the method further comprises providing at least one buffer layer between each internal trench aperture and the semiconductor substrate. However, the at least one buffer layer between each peripheral trench aperture and the semiconductor substrate has an aggregate thickness that is greater than the at least one buffer layer between each internal trench aperture and the semiconductor substrate. (For example, the at least one buffer layer between each internal trench aperture and the semiconductor substrate can consist of a single buffer layer, while the at least one buffer layer between each peripheral trench aperture and the semiconductor substrate consists of two buffer layers.) As a result, an internal trench is etched through the at least one buffer layer and into the semiconductor substrate at each internal trench aperture position during the etching procedure, while a trench is not etched through the at least one buffer layer (and hence not into the substrate) at each peripheral trench aperture position.

Preferred buffer layers include oxide layers and nitride layers. A preferred substrate is a silicon substrate.

A number of devices can be used in connection with the modified substrate and method of the present invention, including trench DMOS transistors, trench Schottky barrier rectifiers, and a DRAM device.

According to a further aspect of the present invention, a trench DMOS transistor structure that includes at least one peripheral trench and a plurality of internal trenches is provided. The structure comprises: (1) a substrate of a first conductivity type; (2) a body region on the substrate having a second conductivity type, wherein the peripheral and internal trenches extend through the body region; (3) an insulating layer that lines each of the peripheral and internal trenches; (4) a first conductive electrode overlying each insulating layer; and (5) source regions of the first conductivity type in the body region adjacent to the each internal trench, but not adjacent to the at least one peripheral trench. The structure can also comprise a drain electrode disposed on a surface of the substrate opposing the body region and a source electrode disposed over at least a portion of the source regions.

Preferably, the first conductivity type is n-type conductivity and the second conductivity type is p-type conductivity. Preferably, the insulating layer is an oxide layer and the conductive electrode comprises polysilicon. In certain preferred embodiments, the trench DMOS transistor structure further comprises an insulating region (such as a borophosphosilicate glass structure) over each first conductive electrode in the internal trenches.

One advantage of the present invention is that adverse optical edge effects associated with peripheral trench features are dealt with in an effective and economical manner.

Another advantage of the present invention is that the performance of products with peripheral trench features, such as trench DMOS devices, trench Schottky battier rectifiers, DRAM devices, and other devices employing peripheral trench features, is substantially improved.

These and other embodiments and advantages of the present invention will become readily apparent upon review of the Detailed Description and Claims to follow.

DETAILED DESCRIPTION OF THE INVENTION

The present invention now will be described more fully hereinafter with reference to the accompanying drawings, in which preferred embodiments of the invention are shown. This invention may, however, be embodied in different forms and should not be construed as being limited to the embodiments set forth herein.

As used herein, the term "peripheral trench" refers to a trench, or a portion thereof, which is formed in a surface and is flanked on one side, but not the other, by one or more similar structures. Similarly, the term "internal trench" refers to a trench, or a portion thereof, which is formed in a surface and is flanked on both sides by one or more similar structures. An "internal trench aperture" refers to an aperture in a patterned etch resistant layer which, upon a sufficient depth of etching through the aperture, leads to the formation of an internal trench. A "peripheral trench aperture" refers to an aperture in a patterned etch resistant layer which, upon a sufficient depth of etching through the aperture, leads to the formation of a peripheral trench. As seen below, in some embodiments of the present invention, a peripheral trench aperture does not actually lead to the formation of a trench in a semiconductor substrate upon etching, but rather leads instead to only the formation of a shallow trench in a buffer layer.

Figure 4A:
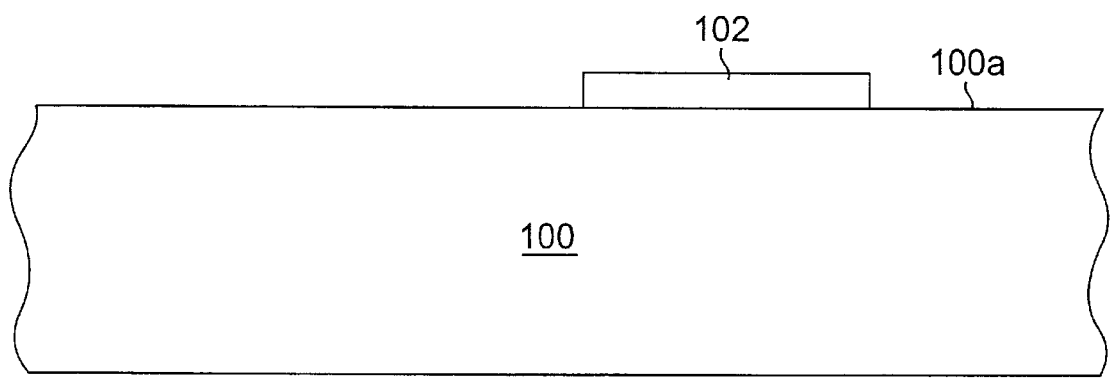
FIGS. 4A–4C are cross-sectional views illustrating a process of trench formation according to an embodiment of the present invention.
Figure 4B:
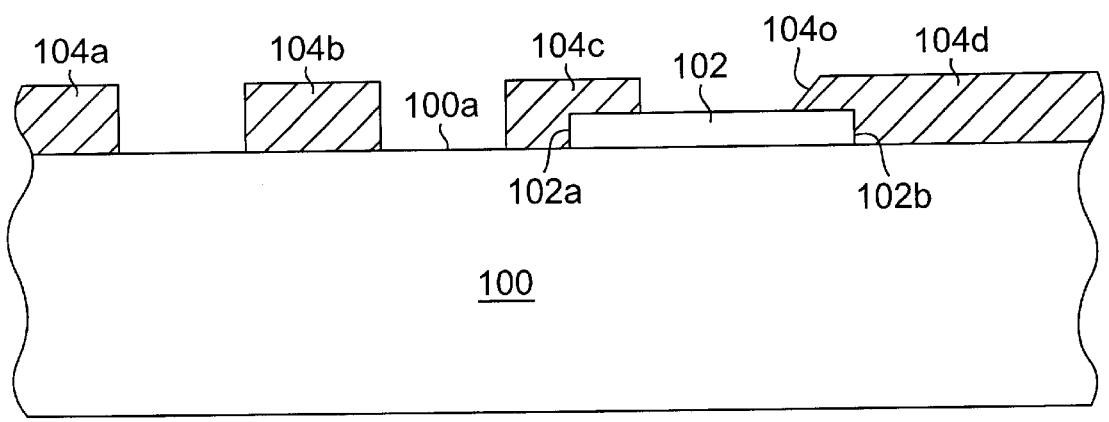
Figure 4C:
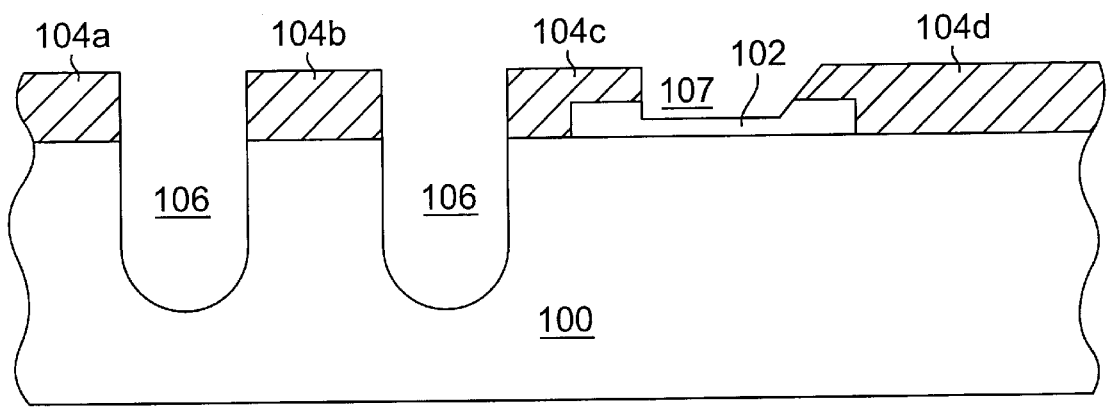

A first embodiment of the present invention is presented in accordance with FIGS. 4A–4C. As shown in FIG. 4A, a nitride or oxide feature 102, preferably formed from a silicon oxide or silicon nitride layer, is formed using techniques known in the art, for example chemical vapor deposition (CVD), on surface 100a of substrate 100, preferably a silicon substrate.

Then, as seen in FIG. 4B, a patterned photoresist layer with features 104a, 104b, 104c and 104d is provided on portions of surface 100a and on portions of oxide or nitride feature 102 (features 104c and 104d partially cover opposing sides 102a and 102b of feature 102, leaving the central top surface of feature 102 exposed). Unlike features 104a, 104b and 104c, feature 104d is not flanked by two other features and is hence suffers from an optical edge effect, as evidenced in FIG. 4B by oblique face 104o.

The structure of FIG. 4B is then subjected to an etch step, such as a reactive ion etching (RIE) step, wherein substrate 100 is preferentially etched relative to oxide or nitride feature 102. As a result, as seen in FIG. 4C, trenches 106 are formed between features 104a and 104b, as well as between features 104b and 104c, in substrate 100. Due to the presence of oxide or nitride feature 102 between features 104c and 104d, however, only a shallow trench 107 is formed in nitride feature 102, and no trench is formed in substrate 100.

Figure 1A:
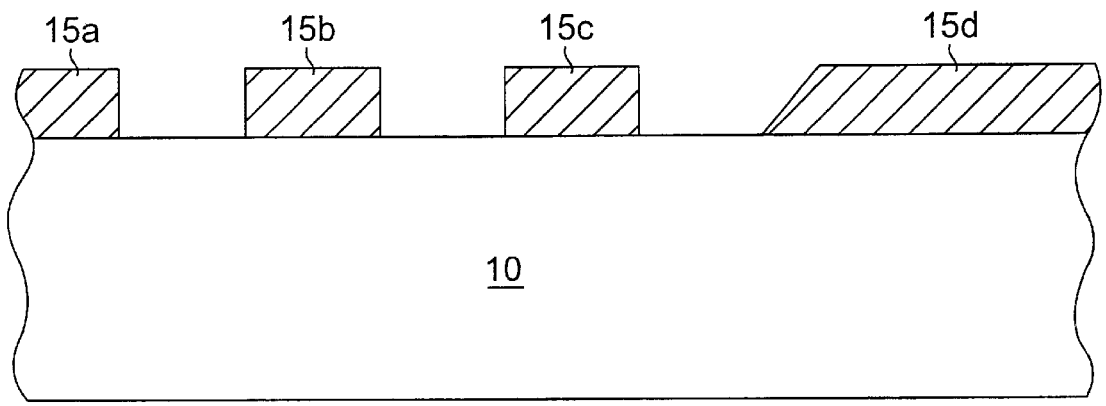
FIG. 1A is a cross-sectional view of a semiconductor substrate after application of a patterned photoresist pattern.
Figure 1B:
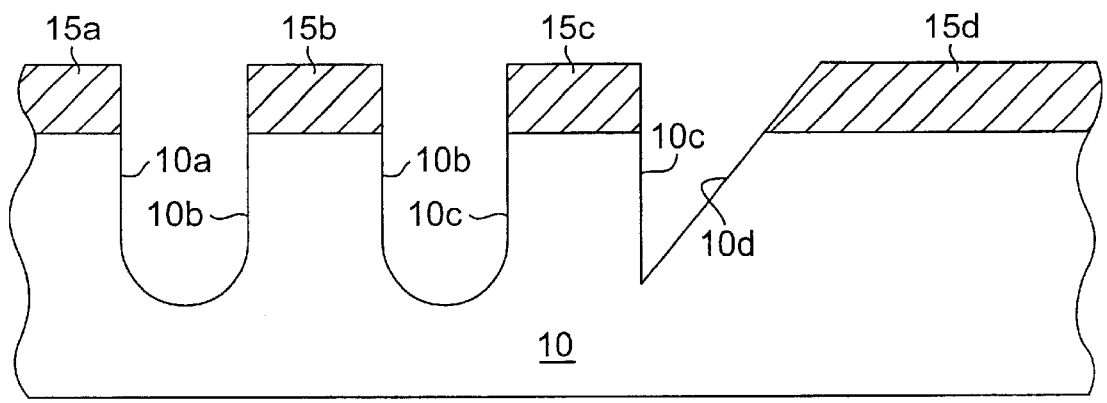
FIG. 1B is a cross-sectional view of a semiconductor substrate after application of a patterned photoresist pattern and subsequent etching.

As seen from FIG. 1B above, had a trench been formed in the substrate at this peripheral position in the absence of oxide or nitride feature 102, such a trench would have been expected to have a sharp-cornered bottom, due to the optical edge effect. Hence, by providing an oxide or nitride feature 102 underneath a peripheral trench aperture in photoresist layer 104, an adverse outcome is prevented.

Figure 5A:
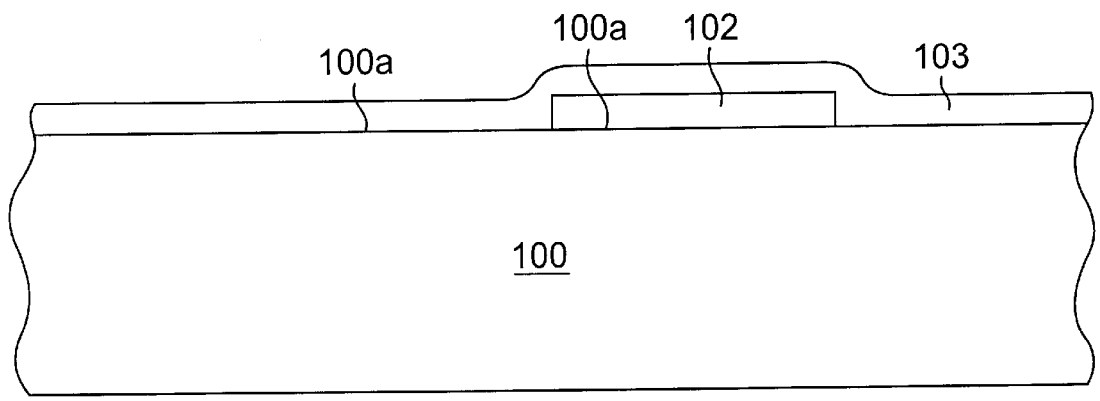
FIGS. 5A–5C are cross-sectional views illustrating a process of trench formation according to an embodiment of the present invention.
Figure 5B:
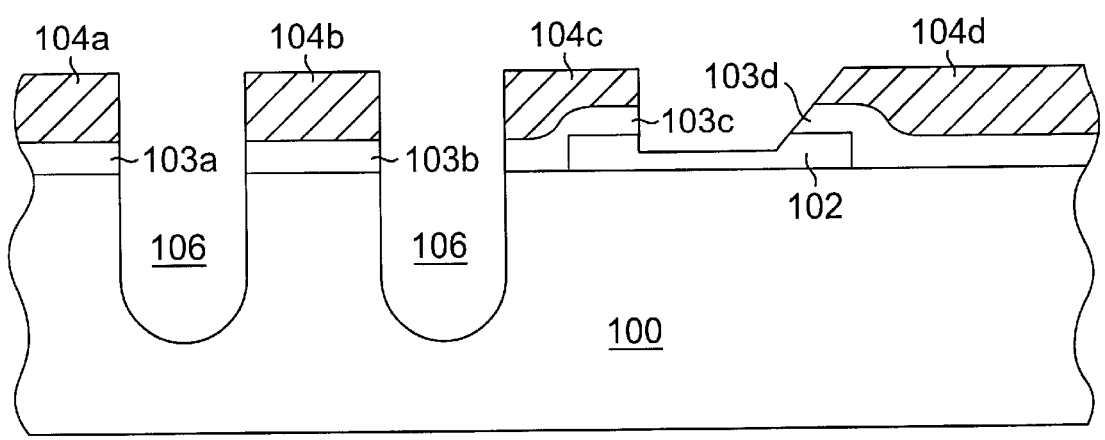
Figure 5C:
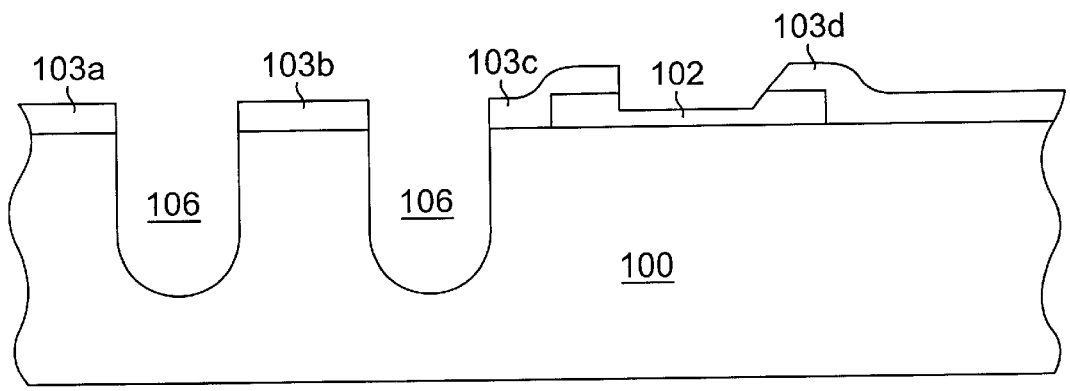

A second embodiment is presented in connection with FIGS. 5A–5C. As seen in FIG. 5A, a nitride or oxide feature 102 is formed using techniques known in the art, such as CVD, on surface 100a of substrate 100. Subsequently, a nitride or oxide layer 103 is provided over surface 100a and over oxide or nitride feature 102, also using techniques known in the art such as CVD.

Figure 3:
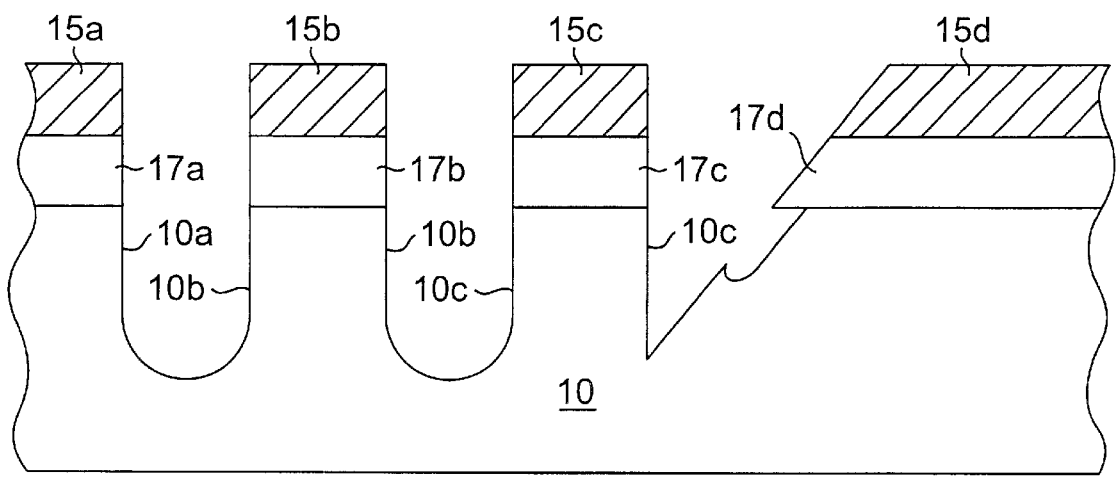
FIG. 3 is a cross-sectional view of the semiconductor substrate of FIG. 2A, after etching through photoresist and oxide or nitride features.

As seen in FIG. 5B, a patterned photoresist layer, having photoresist features 104a, 104b, 104c, 104d, is provided over oxide or nitride layer 103. Then, an oxide or nitride etching process, such as reactive ion etching, is carried out in which oxide or nitride layer 103 is patterned, and trenches 106 are formed in the substrate 100, as shown. This etching step is sufficient to etch through oxide or nitride layer 103, but it is not sufficient to also etch through oxide or nitride layer 102. Hence, apertures are provided in the oxide or nitride layer 103 between photoresist features 104a and 104b, between features 104b and 104c, as well as between features 104c and 104d. Moreover, trenches 106 are etched in substrate 100 through apertures defined by features 104a/103a and 104b/103b, as well as by features 104b/103b and 104c/103c. However, due to the additional oxide or nitride thickness, an aperture is not provided in oxide or nitride layer 102 between photoresist features 104c and 104d, so no trench is formed in substrate 100 at the location. As seen from FIG. 3 above, had a trench been formed in the substrate 100 at a peripheral position defined by features 104c/013c and 104d/103d, such a trench would have been expected to have both a sharp-cornered bottom and an undercut at the right-hand side of the trench.

Figure 2A:
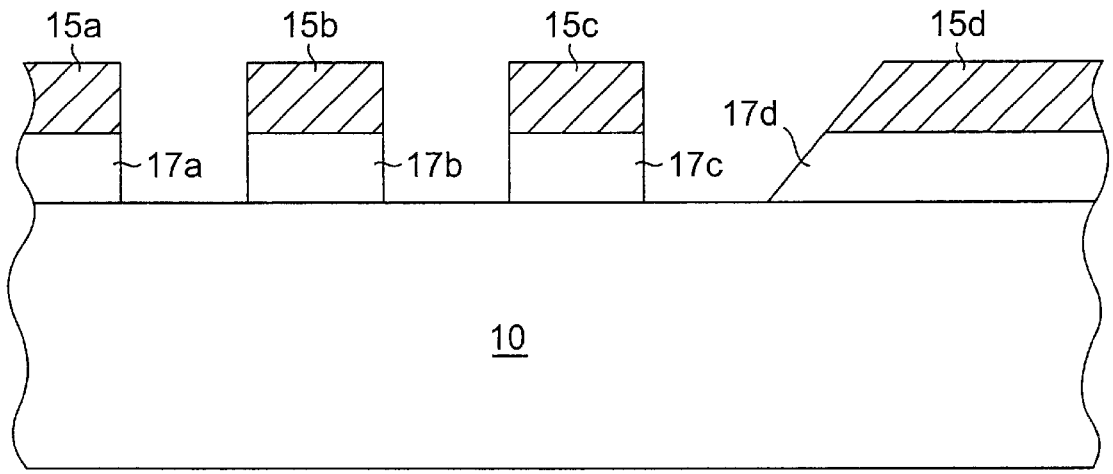
FIG. 2A is a cross-sectional view of a semiconductor substrate that has been provided with photoresist and oxide or nitride features.
Figure 2B:
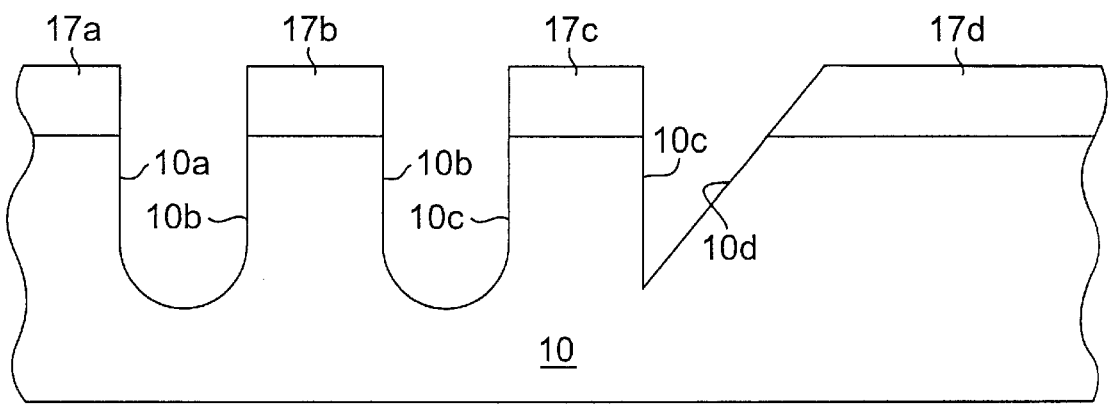
FIG. 2B is a cross-sectional view of the semiconductor substrate of FIG. 2A, after removal of photoresist and after etching through the remaining oxide or nitride features.

The structure shown in FIG. 5C is formed by the same procedure discussed above in connection with FIGS. 5A and 5B, except that photoresist features 104a, 104b, 104c and 104d are removed prior to the trench etch step. Had a trench been formed in the substrate 100 at a peripheral position defined by features 103c and 103d, such a trench would have been expected to have suffered from an adverse optical edge effect like that shown in FIG. 2B, wherein the trench has a sloping sidewall and a sharp-cornered bottom.

Figure 6:
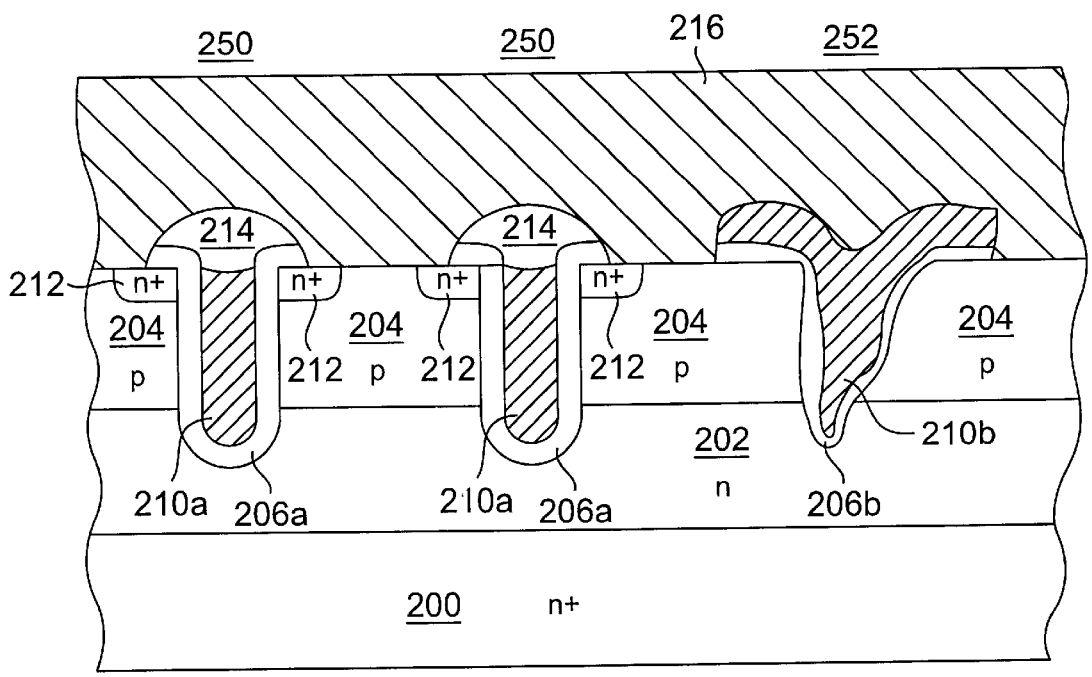
FIG. 6 is a cross-sectional view of a trench DMOS transistor according to an embodiment of the present invention.

A further embodiment of the invention is set forth in connection with FIG. 6. FIG. 6 illustrates two trench DMOS cells 250 constructed in accordance with the present invention. Like prior art devices, trench DMOS cells 250 include, within this embodiment, an n+ substrate 200 upon which is grown a lightly n-doped epitaxial layer 202, which serves as the drain for the DMOS cells 250. A conductive layer (not shown) is applied to the bottom of n+ substrate and acts as a common drain contact for the DMOS cells. Within portions of n-doped epitaxial layer 202, body regions 204 of opposite (p-type) conductivity are provided and act as the gate region for the DMOS cells 250. n+ regions 212 are also provided, which act as sources for the DMOS cells 250. Conductive layer 216 acts as a common source contact for the DMOS cells 250, shorting sources (i.e., n+ regions 212) with one another. Trench regions lined with oxide layers 206a and filled with polysilicon 210a are provided. The filled trenches filled with oxide 206a and polysilicon 210a act as gate electrodes for the DMOS cells 250. Polysilicon 210a is insulated from conductive layer 216 (source contact) by BPSG (borophosphosilicate glass) structures 214, allowing the gates and sources to be independently biased.

As noted above, due to optical edge effects, peripheral trenches are typically defective. As a result, in the instance where a peripheral DMOS device is formed, shorting between the gate and source of the peripheral DMOS device frequently occurs. To prevent this from happening, a dummy peripheral device 252 is created in this embodiment. In this case, although the peripheral (right-hand) trench is filled with oxide layer 206b and polysilicon 210b, it is not provided with an n+ source region (and hence need not be provided with a BPSG insulating structure). In this way, the possibility that shorting between gate and source will occur in connection with the peripheral trench is prevented, because a source is entirely eliminated.

As previously noted, polysilicon regions 210a associated with DMOS cells 250 must be electrically insulated from source contact 216 for proper operation. In contrast, the polysilicon region 210b associated with dummy peripheral device 252 can be shorted to source contact 216. Frequently, polysilicon regions 210a associated with DMOS cells 250 are electrically connected together (not shown), allowing a group of discrete devices to behave as if it were a single large transistor. However since source contact 216 is shorted to polysilicon region 210b in dummy peripheral device 252, care must be taken to ensure that polysilicon 210b is not electrically connected to polysilicon 210a. Otherwise a short would be established between the sources and gates of the DMOS device(s). This would typically be accomplished by isolating the peripheral trench from the other trenches.

A process for forming the structure of FIG. 6 is now briefly described. During the initial process steps, the DMOS cells 250 and the dummy peripheral device 252 are constructed in the same way, using process steps that are well known in the art. For example, an N-doped epitaxial layer 202 is grown on a conventionally N+ doped substrate 200. Then a P-body region 204 is formed in an implantation and diffusion step. Since the P-body region is uniform across the substrate, no mask is needed. The surface of the epitaxial layer is then covered with an oxide layer, which is conventionally exposed and patterned to leave mask openings in the oxide layer. Trenches are dry etched through the mask openings, for example, by reactive ion etching. As seen in FIG. 6, the peripheral (right-hand) trench corresponding to dummy peripheral device 252 is typically flawed due to the optical edge effect. An oxide layer 206 is then deposited on the entire structure so that it covers the trench walls and the surface of P-body region 204. Next, a polysilicon layer 210 is provided over the entire surface, filling the trenches. The polysilicon layer 210 is typically doped with phosphorous chloride or implanted with arsenic or phosphorous to reduce its resistivity.

At this point, a masking layer is applied over the peripheral (right-hand) trench. Then, polysilicon layer 210 and oxide layer 206 are etched to optimize the thickness of the polysilicon layer 210 and expose portions of the P-body between the trenches. Next, a photoresist masking process is used to form a patterned masking layer having apertures that define n+ regions 212. The n+ regions 212 are typically formed in an implantation and diffusion process. No aperture is provided, and hence no N+ region is formed, in connection with the formation of dummy peripheral device 252. Masking layers are then removed in a conventional manner. Subsequently, the DMOS cells are completed in a conventional manner by forming and patterning a BPSG layer over the structure to define BPSG regions 214. (As previously noted, since dummy peripheral device contains no N+ source region, no BPSG region is needed.) Conductive layer 216 is then applied over the entire structure as shown.

Although various embodiments are specifically illustrated and described herein, it will be appreciated that modifications and variations of the present invention are covered by the above teachings and are within the purview of the appended claims without departing from the spirit and intended scope of the invention. As a specific example, the method of the present invention may be used to form a structure in which the conductivities of the various semiconductor regions are reversed from those described herein.

What is claimed is:

1. A modified semiconductor substrate comprising:
   semiconductor substrate;
   at least one buffer layer provided over at least a portion of said substrate; and
   a plurality of trenches comprising (a) a plurality of internal trenches that extend into said semiconductor substrate and (b) at least one shallow peripheral trench that extends into said at least one buffer layer but does not extend into the semiconductor substrate,
   wherein said at least one buffer layer is provided over said semiconductor substrate in the area of said at least one shallow peripheral trench and no buffer layer is provided over said semiconductor substrate in the area of said plurality of internal trenches.

2. The modified semiconductor substrate of claim 1, wherein the at least one buffer layer is an oxide layer.

3. The modified semiconductor substrate of claim 1, wherein the semiconductor substrate is a silicon substrate.

4. A trench DMOS transistor comprising the modified substrate of claim 1.

5. A DRAM device comprising the modified substrate of claim 1.

6. A modified semiconductor substrate comprising:
   a semiconductor substrate;
   at least one buffer layer provided over at least a portion of said substrate; and
   a plurality of trenches comprising (a) a plurality of internal trenches that extend into said semiconductor substrate and (b) at least one shallow peripheral trench that extends into said at least one buffer layer but does not extend into the semiconductor substrate,
   wherein the at least one buffer layer is a nitride layer.

7. A trench Schottky barrier rectifier comprising a modified semiconductor substrate, the substrate comprising:
   a semiconductor substrate;
   at least one buffer layer provided over at least a portion of said substrate; and
   a plurality of trenches comprising (a) a plurality of internal trenches that extend into said semiconductor substrate and (b) at least one shallow peripheral trench that extends into said at least one buffer layer but does not extend into the semiconductor substrate.

8. A modified semiconductor substrate comprising
   a semiconductor substrate;
   at least one buffer layer provided over at least a portion of said substrate; and
   a plurality of trenches comprising (a) a plurality of internal trenches that extend into said semiconductor substrate and (b) at least one shallow peripheral trench that extends into said at least one buffer layer but does not extend into the semiconductor substrate,
   wherein said at least one buffer layer is provided over said semiconductor substrate in the area of said at least one shallow peripheral trench, wherein said at least one buffer layer is provided over said semiconductor substrate in the area of said plurality of internal trenches,
   wherein said at least one buffer layer in the area of said plurality of internal trenches is thinner than said at least one buffer layer in the area of said at least one shallow peripheral trench,
   wherein each internal trench extends through said at least one buffer layer in the area of said plurality of internal trenches and into said semiconductor substrate, and wherein each shallow peripheral trench does not extend through said at least one buffer layer in the area of said at least one shallow peripheral trench and does not extend into said semiconductor substrate.

9. The modified semiconductor substrate of claim 8, wherein said at least one buffer layer in the area of said plurality of internal trenches consists of a single buffer layer and wherein said at least one buffer layer in the area of said at least one shallow peripheral trench consists of two buffer layers.

10. The modified semiconductor substrate of claim 8, wherein the at least one buffer layer is an oxide layer.

11. The modified semiconductor substrate of claim 8, wherein the semiconductor substrate is a silicon substrate.

12. A trench DMOS transistor comprising the modified substrate of claim 8.

13. A DRAM device comprising the modified substrate of claim 8.

* * * * *